United States Patent
Hashimoto (10) Patent No.: US 7,167,013 B2
(45) Date of Patent: Jan. 23, 2007

(54) SUCTION CAP FOR IC SOCKETS AND IC SOCKET ASSEMBLY USING SAME

(75) Inventor: Shinichi Hashimoto, Kanagawa (JP)

(73) Assignee: Tyco Electronics AMP K.K, Kanagawa-Ken (JP)

( * ) Notice: Subject to any disclaimer, the term of this patent is extended or adjusted under 35 U.S.C. 154(b) by 55 days.

(21) Appl. No.: 10/831,006

(22) Filed: Apr. 23, 2004

(65) Prior Publication Data

US 2004/0251891 A1    Dec. 16, 2004

(30) Foreign Application Priority Data

Apr. 25, 2003    (JP)    ............... 2003-121984

(51) Int. Cl.
*G01R 31/02*    (2006.01)
*H01R 13/625*    (2006.01)
(52) U.S. Cl. ............... 324/755; 439/68; 439/342
(58) Field of Classification Search ............... None
See application file for complete search history.

(56) References Cited

U.S. PATENT DOCUMENTS

| 4,560,216 A | * | 12/1985 | Egawa ............... 439/41 |
| 2004/0095693 A1 | * | 5/2004 | Shirai et al. ............... 361/1 |
| 2004/0175974 A1 | * | 9/2004 | Ma et al. ............... 439/135 |

FOREIGN PATENT DOCUMENTS

| JP | 2-86090 | 7/1990 |
| JP | 2002-343517 | 11/2002 |

* cited by examiner

*Primary Examiner*—Ernest Karlsen
(74) *Attorney, Agent, or Firm*—Barley Snyder LLC (57) ABSTRACT

An IC socket suction cap and an IC socket assembly that employs the suction cap are configured to reduce the risk of deforming a housing of the IC socket assembly. The IC socket assembly includes a loading plate for applying pressure on the IC socket housing by the operation of a lever. The IC socket suction cap includes a flat suction surface, latch arms for latching and engaging the housing, and loading plate holding pieces, for holding the loading plate in a state in which it does not exert pressure onto the housing.

9 Claims, 10 Drawing Sheets

SUCTION CAP FOR IC SOCKETS AND IC SOCKET ASSEMBLY USING SAME

FIELD OF THE INVENTION

The present invention relates to a suction cap for an IC socket, and to an IC socket assembly that employs the suction cap.

BACKGROUND OF THE INVENTION

Japanese Unexamined Patent Publication No. 2002-343517 discloses a suction cap for an IC socket and an IC socket assembly that utilizes the suction cap, in which a slide member is driven by a cam shaft. The suction cap comprises a flat suction surface and latch arms for latching and engaging with an insulative housing of an IC socket. The latch arms latch and engage with a central opening of the flat insulative housing to fix the suction cap to the IC socket when the suction cap is placed on an IC package mounting surface of the IC socket. Electrical connections between an IC package and contacts, which are housed in the housing, are established by the sliding motion of the slide member.

When a loading plate is used with this structure, there is not sufficient resistance against deformation of the housing, which would be caused by pressure from the loading plate. If a configuration is adopted in which the loading plate is not loaded, then the lever cannot be fixed.

Japanese Unexamined Utility Model Publication No. 2(1990)-86090 discloses another type of IC socket, in which electrical connections are established between the IC socket and an IC package by use of a lever. The lever drives a slide member so that it slides along the IC socket, to establish electrical connections between the IC package and the IC socket. A suction cap is not employed in this IC socket.

If a suction surface is provided on the slide member of this structure, space must be provided on the slide member for the suction surface. Accordingly, the area available for electrical contacts becomes restricted, and this structure becomes difficult to apply to an IC package having a great number of contacts.

The two IC sockets described above establish electrical connections between IC packages and IC sockets via a slide member, which is driven by a lever or a cam. There are other IC sockets, in which electrical connections are established by pressing an IC package against an IC socket with a loading plate.

Generally, suction caps are built into IC sockets prior to shipping. Levers are configured to be substantially parallel to the housings of the IC sockets during use to reduce the height of the IC sockets. Accordingly, for IC sockets that utilize loading plates, the loading plates are in contact with the housings. In this state, there is a risk that force will be exerted on the housings during shipment, resulting in the housings being deformed during the period between shipment and mounting onto circuit boards. If the housings are deformed, the bottom surfaces, that is, circuit board mounting surfaces thereof will not be parallel to the circuit boards. Therefore, there is a risk that the reliability of the electrical connections between the IC sockets and the circuit boards will deteriorate.

SUMMARY OF THE INVENTION

An IC socket suction cap and an IC socket assembly that employs the suction cap are configured to reduce the risk of deforming a housing of the IC socket assembly. The IC socket assembly includes a loading plate for applying pressure on the IC socket housing by the operation of a lever. The IC socket suction cap includes a flat suction surface, latch arms for latching and engaging the housing, and loading plate holding pieces, for holding the loading plate in a state in which it does not exert pressure onto the housing.

DETAILED DESCRIPTION OF THE INVENTION

Figure 1:
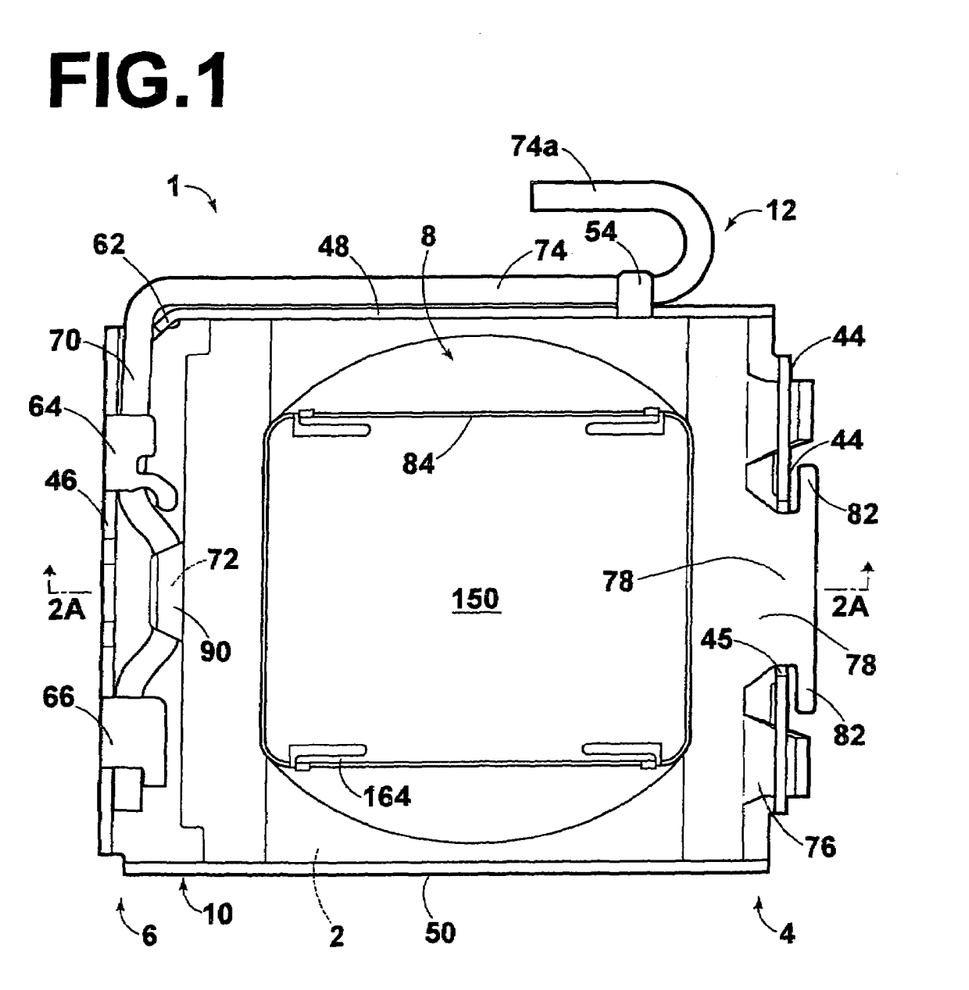
FIG. 1 is a plan view of an IC socket assembly, on which a suction cap is mounted according to an exemplary embodiment of the present invention.
Figure 2A:
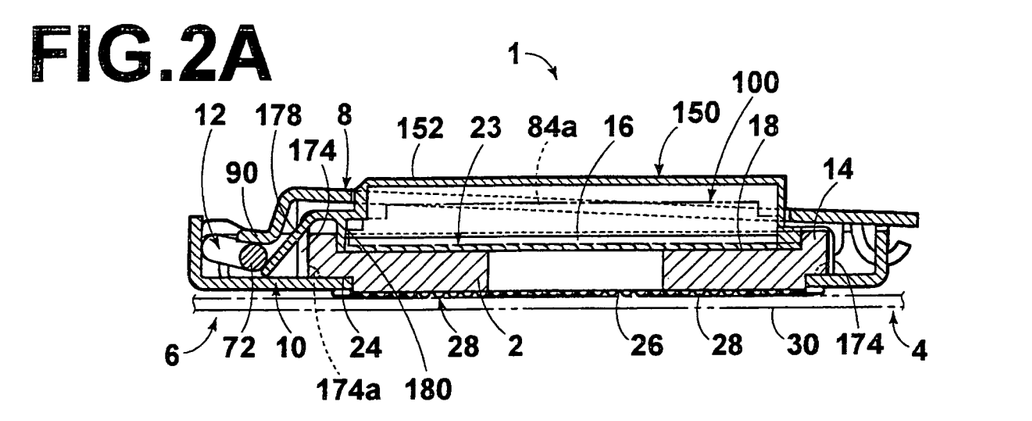
FIG. 2A is a sectional view of the IC socket assembly of FIG. 1 taken along the line 2A—2A in FIG. 1.
Figure 2B:
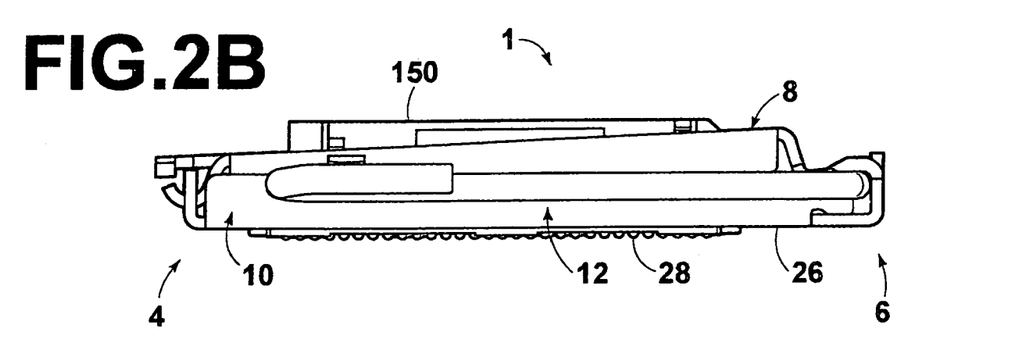
FIG. 2B is a rear view of the IC socket assembly of FIG. 1.
Figure 2C:
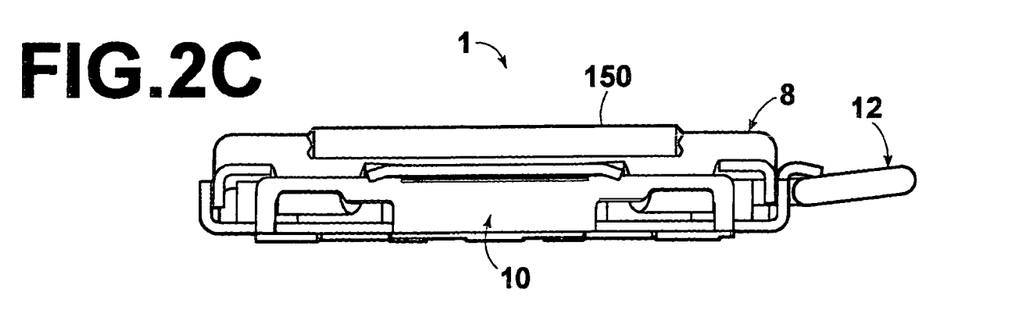
FIG. 2C is a side view of the IC socket assembly of FIG. 1.

Hereinafter, preferred embodiments of a suction cap which is suctioned by a suction nozzle of an apparatus during moving and mounting of the IC socket onto a printed circuit board, and an IC socket assembly will be described in detail with reference to the attached drawings. FIG. 1 is a plan view of an IC socket assembly 1 (hereinafter, simply referred to as "assembly 1"), on which a suction cap 150 is mounted. FIGS. 2A, 2B, and 2C also illustrate the assembly 1 of FIG. 1. FIG. 2A is a sectional view taken along the line 2A—2A in FIG. 1. FIG. 2B is a rear view of the assembly 1. FIG. 2C is a side view of the assembly 1.

The assembly 1 will be described with reference to FIG. 1, FIG. 2A, FIG. 2B, and FIG. 2C. The assembly 1 comprises: an insulative housing 2 (hereinafter, simply referred to as "housing", shown in FIG. 2A); a substantially rectangular loading plate 8, which is pivotally attached at a first end 4 of the housing 2, and which has a substantially rectangular opening 84; a reinforcing plate 10, which is attached to the bottom surface of the housing 2; and a lever 12, which is axially supported at a second end 6 of the housing 2. The lever 12 functions to press a lock piece 90, which is provided on the free end of the loading plate 8, toward the housing 2, to lock the loading plate in a closed position. Note that in FIG. 1 and FIGS. 2A, 2B, and 2C of the assembly 1, the suction cap 150 is shown and an IC package 100 (indicated by broken lines in FIG. 2A) would be installed later.

Figure 3A:
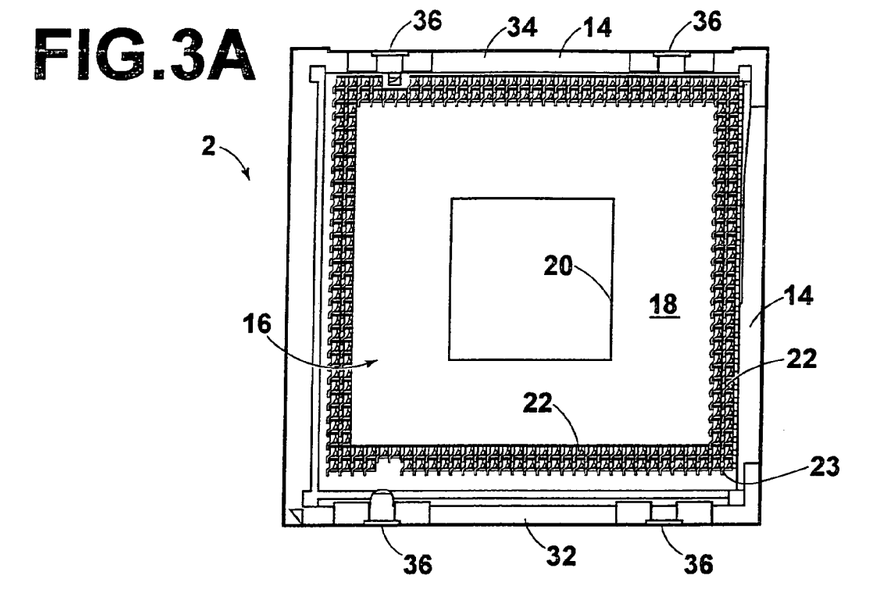
FIG. 3A is a plan view of an insulative housing utilized in the IC socket assembly according to an exemplary embodiment of the present invention.
Figure 3B:
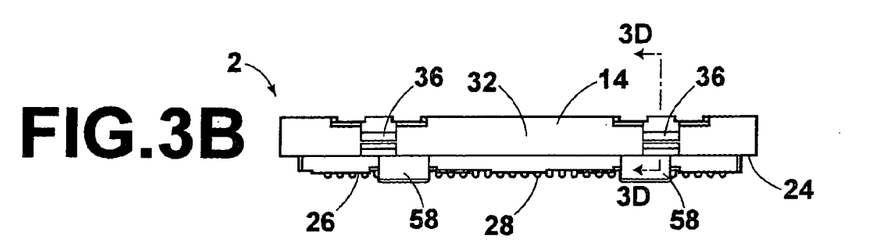
FIG. 3B is a front view of the insulative housing of FIG. 3A.
Figure 3C:
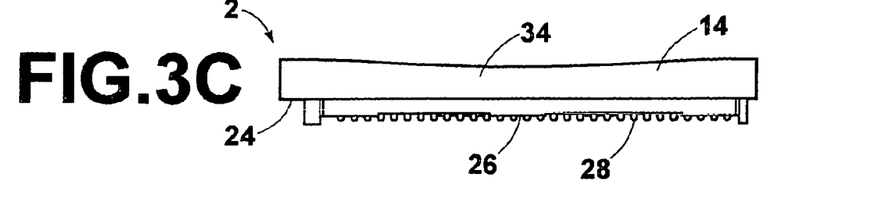
FIG. 3C is a rear view of the insulative housing of FIG. 3A.
Figure 3D:
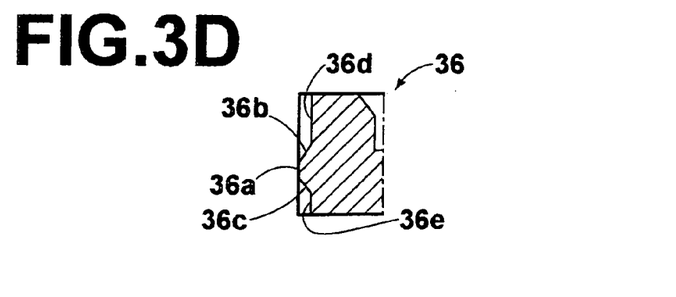
FIG. 3D is a magnified sectional view of a portion of the insulative housing of FIG. 3A taken along the line 3D—3D in FIG. 3B.

Next, the housing 2 will be described with reference to FIG. 2A, FIG. 2B, FIG. 2C, FIG. 3A, FIG. 3B, FIG. 3C, and FIG. 3D. FIG. 3A is a plan view, FIG. 3B is a front view, and FIG. 3C is a rear view of the housing 2. FIG. 3D is a sectional view taken along the line 3D—3D in FIG. 3B. In an exemplary embodiment of the invention, the housing 2 is molded from an insulative material such as synthetic resin or the like, and is of a rectangular plate shape. The housing 2 comprises a package receiving aperture 16 formed in its upper surface, which is defined by outer peripheral walls 14 (shown in FIG. 2A).

A rectangular opening 20 is formed at the center of the bottom surface (IC package mounting surface) 18 of the package receiving aperture 16. A great number of cavities 22, in which electrical contacts 23 are housed, are formed in a matrix in the bottom surface 18. Except for the region of the opening 20, the cavities 22 are formed in substantially all of the bottom surface 18. However, only a portion of the cavities 22 are illustrated in FIG. 3A, and the rest are omitted.

Downward facing steps 24 are formed on the bottom of the housing 2 around the entire periphery thereof. The reinforcing plate 10 abuts the steps 24, the details of which will be described later. Solder balls 28, which are fixed to pads on the contacts 23 for connecting to a circuit board 30 (shown in FIG. 2A), protrude from a circuit board mounting surface 26, on the bottom of the housing 2. Engagement means 36, for engaging the suction cap 150, are formed at two separated positions on each of two opposite facing side surfaces 32 and 34 of the housing 2. In an exemplary embodiment of the invention, as most clearly shown in FIG. 3D, the engagement means 36 comprise: a flat surface 36a, which is coplanar with the side surface 32; inclined surfaces 36b and 36c, which incline away from the side surface 32 above and below the surface 36a, respectively; and vertical surfaces 36d and 36e, which extend vertically from the inclined surfaces 36b and 36c, respectively. The manner of engagement between the suction cap 150 and the engaging portions 36 will be described below. Mounting protrusions 58 (shown in FIG. 3B), for engaging the reinforcing plate 10, are formed in the vicinities of the engagement means 36.

Figure 4A:
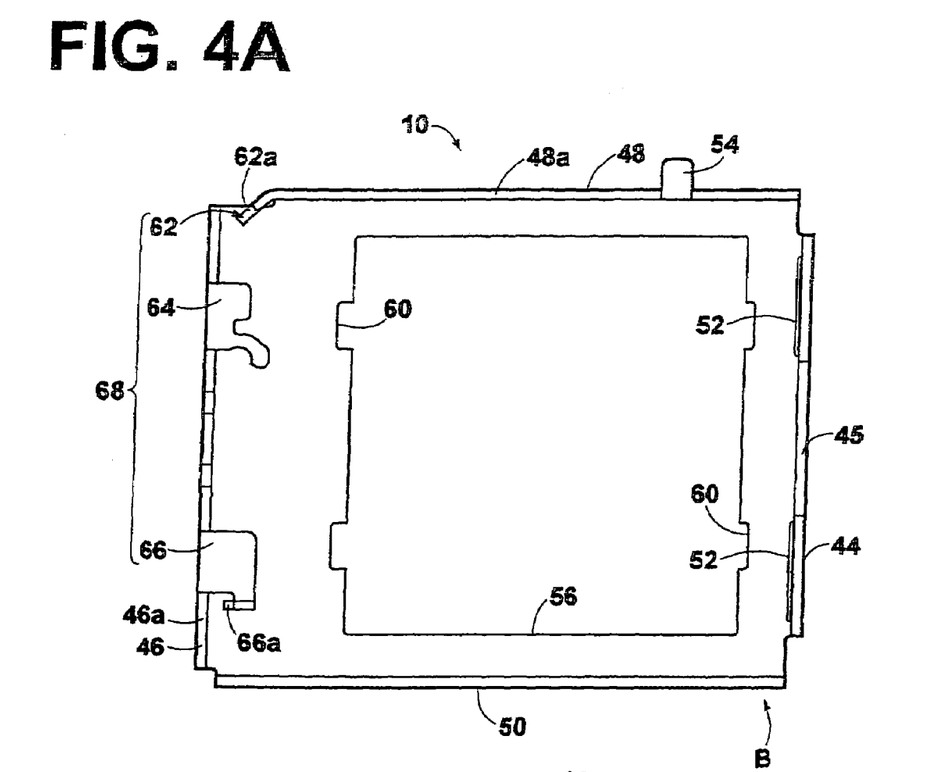
FIG. 4A is a plan view of a reinforcing plate for a IC socket assembly according to an exemplary embodiment of the present invention.
Figure 4B:
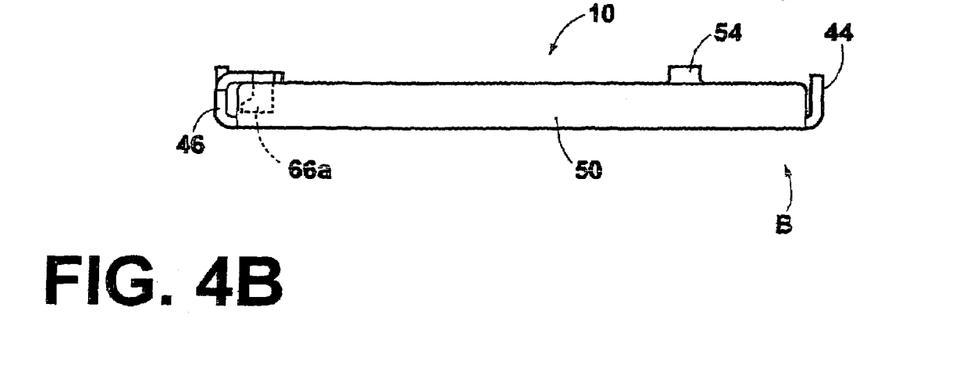
FIG. 4B is a front view of a reinforcing plate of FIG. 4A.
Figure 5A:
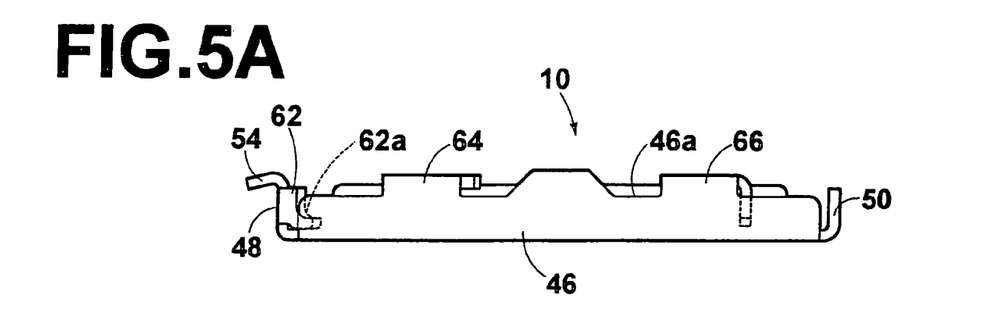
FIG. 5A is a left side view of the reinforcing plate of FIG. 4A.
Figure 5B:
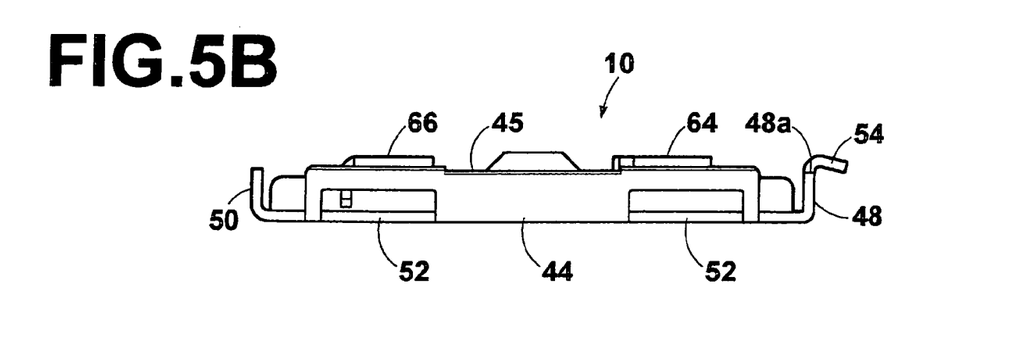
FIG. 5B is a right side view of the reinforcing plate of FIG. 4A.
Figure 5C:
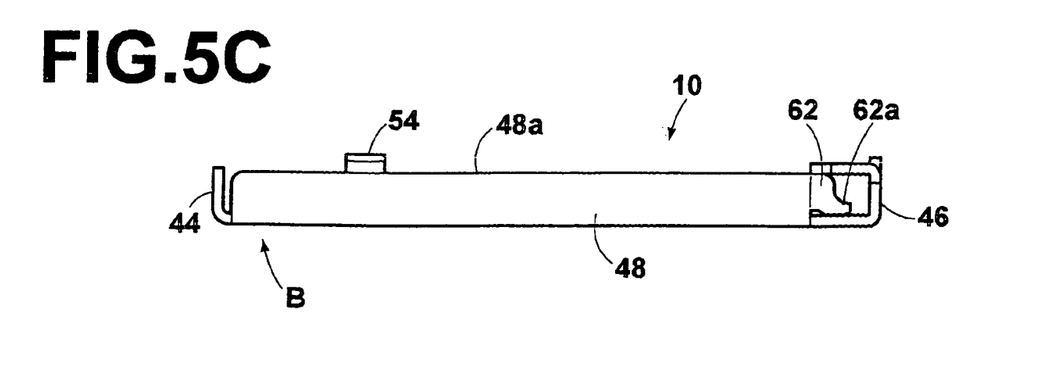
FIG. 5C is a rear view of the reinforcing plate of FIG. 4A.

Next, the reinforcing plate 10, which is provided at the underside of the housing 2, will be described in detail with reference to FIG. 1, FIG. 4A, FIG. 4B, FIG. 5A, FIG. 5B, and FIG. 5C. FIG. 4A is a plan view and FIG. 4B is a front view of the reinforcing plate 10. FIG. 5A is a left side view, FIG. 5B is a right side view, and FIG. 5C is a rear view of the reinforcing plate 10. In an exemplary embodiment of the invention, the reinforcement plate comprises a structural material such as metal. The reinforcing plate 10 may be formed by punching and bending a single metal plate, and is of a rectangular shape. In the same manner as the aforementioned loading plate 8, the side of the reinforcing plate 10 at the first end 4 of the assembly 1 (shown in FIG. 1), and indicated by arrow B in FIGS. 4A and 4B, will be referred to as the front. The side of the reinforcing plate 10 at the second end 6 (shown in FIG. 1) of the assembly 1 will be referred to as the rear. The four edges of the reinforcing plate 10 are bent upward, to form a front wall 44, a rear wall 46, and side walls 48 and 50.

Elongated rectangular openings 52 are formed at the two ends of the front wall 44, separated from each other. The loading plate 8 engages with the openings 52 so that it is pivotable, the details of which will be described later. A shallow cutout 45 is formed in the upper edge of the front wall 44 at the center thereof, between the openings 52. The loading plate 8 is also placed in the cutout 45, which will be described later. The side walls 48 and 50 extend in the front to rear direction. An engaging protrusion 54, for engaging the lever 12, is integrally formed on the upper edge 48a of the side wall 48 so that it extends substantially perpendicular with respect to the side wall 48 toward the exterior. The distal end of the engaging protrusion 54 is bent downward, as shown in FIG. 5B. The downward bend is provided to prevent the lever 12 from being disengaged from the engaging protrusion 54.

A rectangular opening 56, for receiving the lower portion of the housing 2, is formed in the central portion of the reinforcing plate 10. Cutouts 60 are formed in the front and rear edges of the opening 56, corresponding to the mounting protrusions 58 in the housing 2. The mounting protrusions 58 are positioned within the cutouts 60, to secure the relative positions of the reinforcing plate 10 and the housing 2. The lower ends of the mounting protrusions 58 are heated and fused to the reinforcing plate 10, after the mounting protrusions 58 engage with the cutouts 60.

A shaft support 68, for axially supporting the lever 12, is formed at the side wall 48 and the rear wall 46 of the reinforcing plate. The shaft support 68 comprises: an shaft support piece 62, which has an upwardly facing arcuate portion 62a, formed at the rear end of the side wall 48; and a pair of shaft support pieces 64 and 66, which are formed at the upper edge 46a of the rear wall 46. The shaft support pieces 64 and 66 are positioned above two rotational shafts 70 (shown in FIG. 1) of the lever, to prevent it from moving upward. The shaft support piece 66 further comprises a tongue 66a that prevents the rotational shaft 70 of the lever 12 from moving forward. Note that the shaft support piece 62 may alternatively be formed at the rear end of the side wall 50.

Figures 6A, 6C:
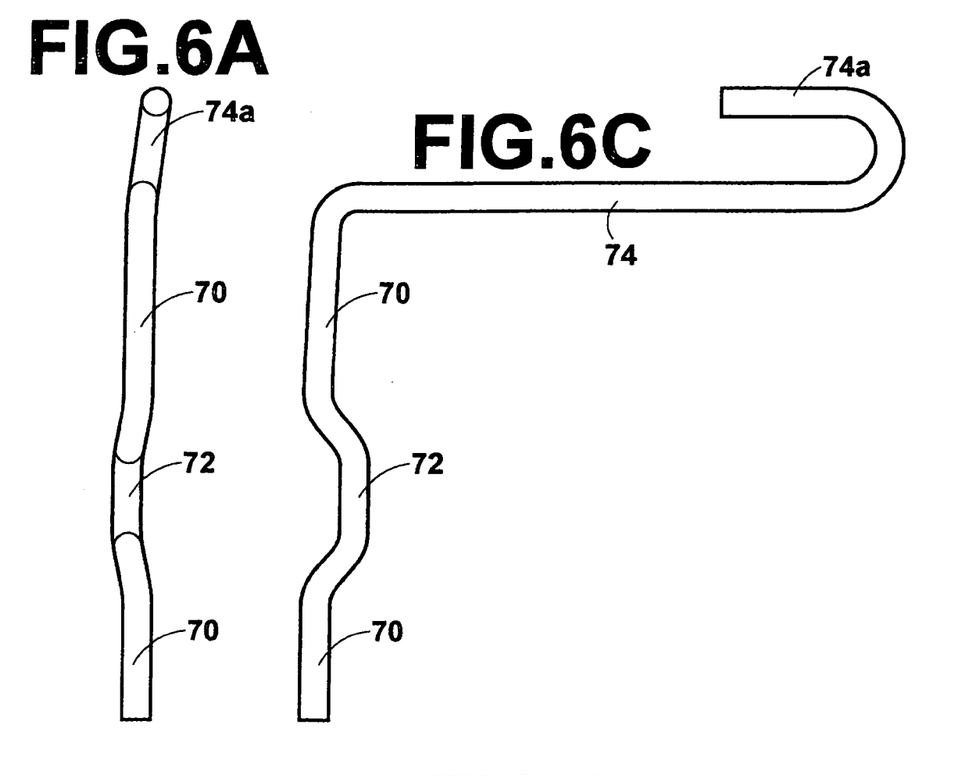
FIG. 6A is a left side view of a lever for an IC socket assembly according to an exemplary embodiment of the present invention.
FIG. 6C is a plan view of the lever of FIG. 6A.
Figure 6B:
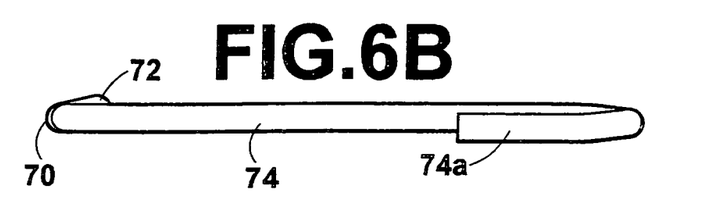
FIG. 6B is a rear view of the lever of FIG. 6A.
Figure 6D:
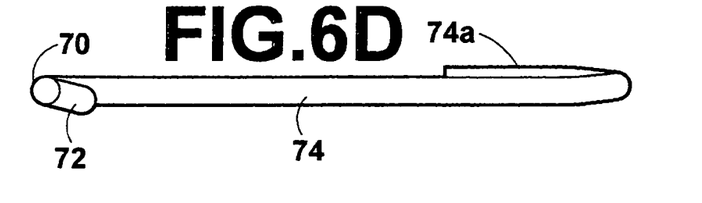
FIG. 6D is a front view of the lever of FIG. 6A.

Next, the lever 12, which is to be mounted onto the reinforcing plate 10 will be described in detail with reference to FIGS. 6A, 6B, 6C, and 6D. FIG. 6A is a left side view, FIG. 6B is a rear view, FIG. 6C is a plan view, and FIG. 6D is a front view of the lever 12. Note that each of FIGS. 6A, 6B, 6C, and 6D are arranged in corresponding relationships amongst each other. The lever 12 is formed by cutting and bending a single metal wire. The lever 12 comprises: the two rotational shafts 70, which are separated from each other and are to be supported by the aforementioned shaft support 68; a lever operating portion, that is, a locking portion 72, which is positioned between the two rotational shafts 70 and is offset from the axis of the two shafts 70; and an operating arm 74, for rotating the rotational shafts 70. The operating arm 74 is bent perpendicularly from the rotational shaft 70 in substantially the same direction as that of the deflection of the locking portion 72. The distal end of the operating arm 74 is bent back into a U-shape, to form a U-shaped portion 74a, which facilitates operation by a finger.

Figure 7A:
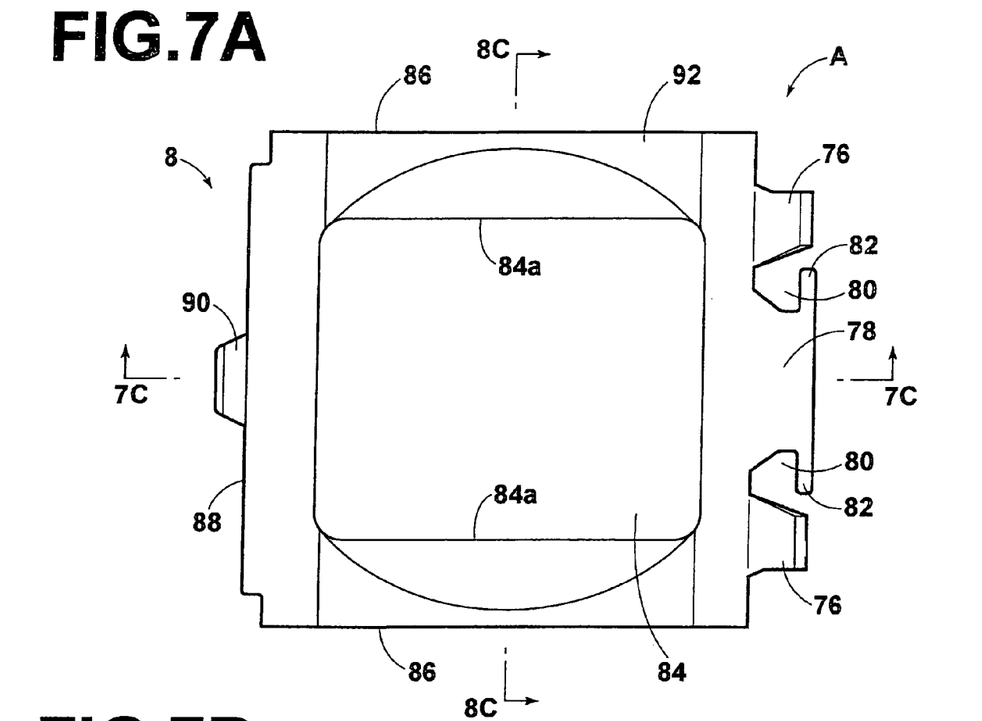
FIG. 7A is a plan view of a loading plate for an IC socket assembly according to an exemplary embodiment of the present invention.
Figure 7B:
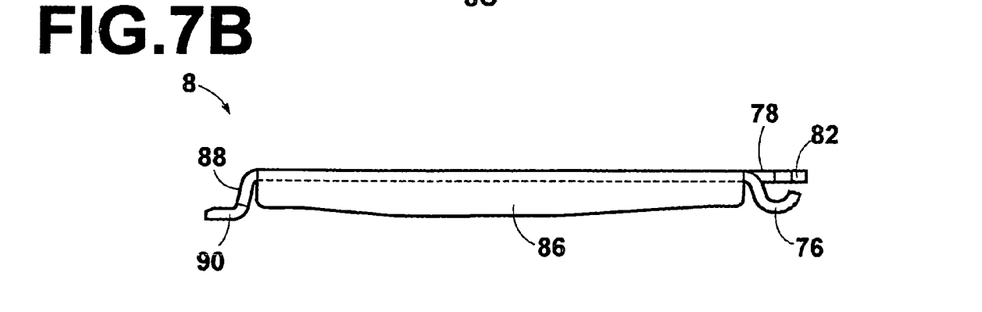
FIG. 7B is a front view of the loading plate of FIG. 7A.
Figure 7C:
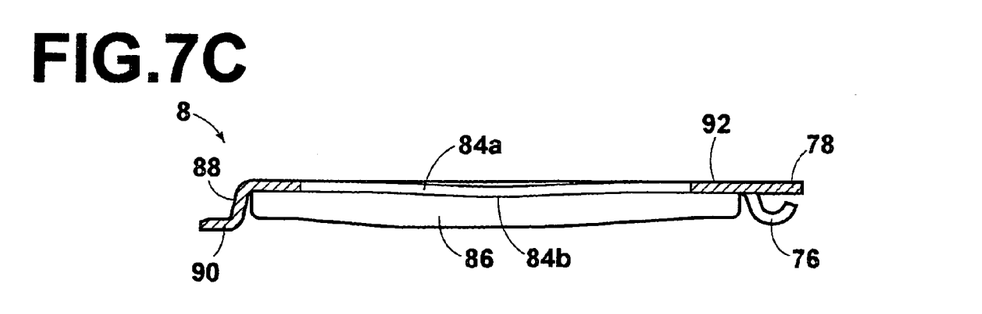
FIG. 7C is a sectional view of the loading plate of FIG. 7A taken along the line 7C—7C in FIG. 7A.
Figure 8A:
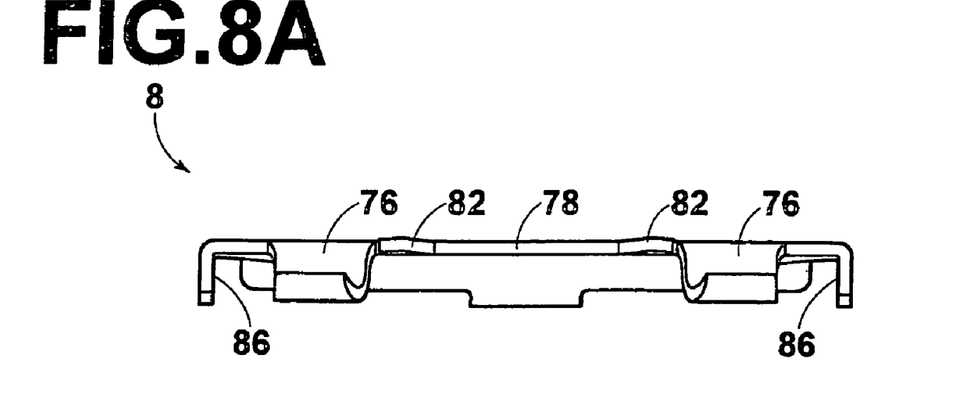
FIG. 8A is a right side view of the loading plate of FIG. 7A.
Figure 8B:
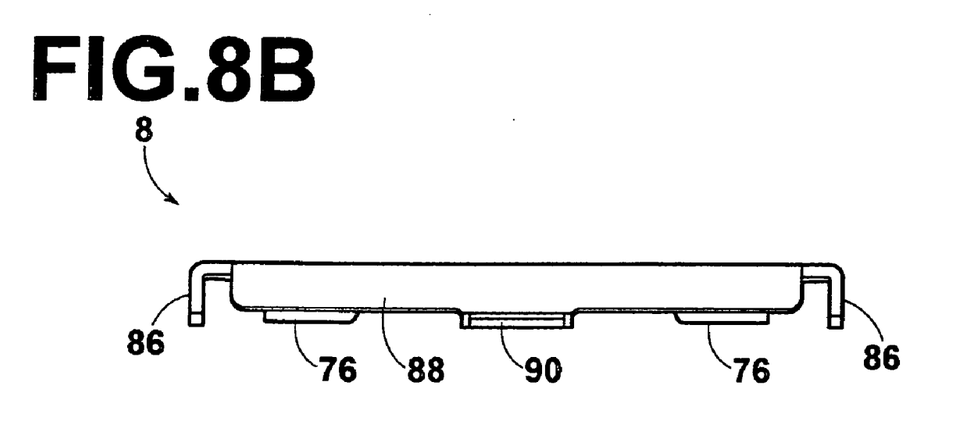
FIG. 8B is a left side view of the loading plate of FIG. 7A.
Figure 8C:
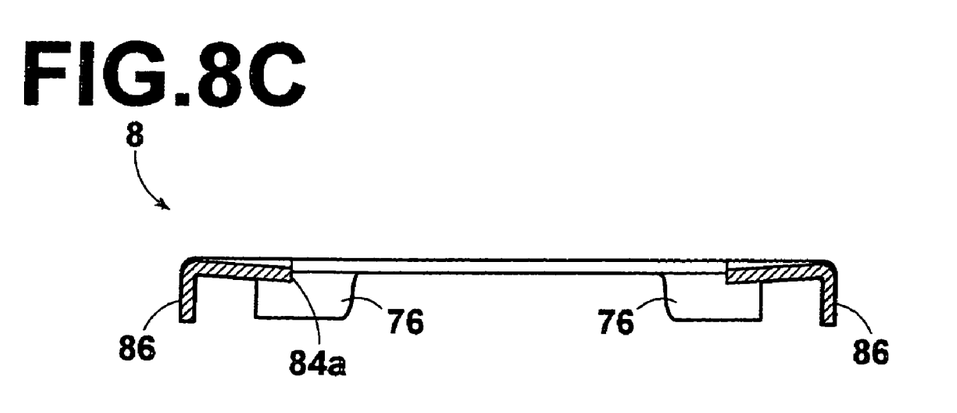
FIG. 8C is a sectional view of the loading plate of FIG. 7A taken along the line 8C—8C in FIG. 7A.

Next, the loading plate 8 will be described with reference to FIGS. 7A, 7B, 7C, 8A, 8B, and 8C. FIG. 7A is a plan view, FIG. 7B is a front view, and FIG. 7C is a sectional view taken along the line 7C—7C in FIG. 7A, of the loading plate 8. FIG. 8A is a right side view, FIG. 8B is a left side view, and FIG. 8C is a sectional view taken along the line 8C—8C in FIG. 7A, of the loading plate 8. Note that in the description, the side of the loading plate 8 at the first end 4 (shown in FIG. 1) of the assembly 1, indicated by arrow A in FIG. 7A, will be referred to as the front. The side of the loading plate 8 at the second end 6 of the assembly 1 (shown in FIG. 1) will be referred to as the rear.

The loading plate 8 is of a rectangular shape and may be formed by punching and bending a single metal plate. A pair of downwardly curving bearing tongues 76 protrude at the front of the loading plate 8. The distal ends of the downwardly curving bearing tongues 76 extend upward. The bearing tongues 76 engage the openings 52 of the reinforcing plate. Thereby, the loading plate 8 is supported by the reinforcing plate 10 so that it is pivotable with respect thereto. A forwardly extending pressing piece 78, which is coplanar with the loading plate 8, protrudes between the bearing tongue pieces 76. Substantially V-shaped cutouts 80 are formed in both sides of the pressing piece 78. Thereby, a pair of extraction preventing pieces 82, extending toward each of the bearing tongue pieces 76, are formed at the front end of the pressing piece 78. The narrow portion, which has been formed by the V-shaped cutouts 80, is arranged in the cutout 45 (shown in FIG. 4) of the reinforcing plate 10. At this time, the extraction preventing pieces 82 are positioned at the exterior of the front wall 44 of the reinforcing plate 10, as illustrated in FIG. 1. If the loading plate 8 is pulled toward the rear, the extraction preventing pieces 82 abut the front wall 44, thereby preventing extraction of the loading plate 8. The loading plate 8 is prevented from being extracted toward the rear also by the engagement of the bearing tongue pieces 76 with the front wall 44. In addition, the loading plate 8 is prevented from being extracted upwardly when it is in an opened state by the extraction preventing pieces 82 engaging the lower edge of the font wall.

A rectangular opening 84, in which an IC package or the suction cap 150 is positioned, is formed in the central portion of the loading plate 8 (shown in FIG. 1 and FIG. 7A). The sides of the loading plate 8 are bent downward, to form side walls 86. A rear wall 88 is formed by bending the rear end of the loading plate 8 downward. A locking piece 90, which extends rearward from the rear wall 88, is formed by bending the central portion of the rear wall 88. The locking piece 90 is configured to engage the locking portion 72 of the lever 12.

Note that, as can be seen in FIG. 7A and FIG. 7C, a main surface 92 of the loading plate 8 from the side walls 86 to the edges 84a of the opening 84 is curved downwardly. The central portions of the edges 84a are the lowermost points of the curved surface. These points are the pressure applying points 84b, by which the IC package is pressed. The pressure applying points 84b contact and press the housing 2 when the loading plate 8 is closed, that is, when the locking portion 72 of the lever 12 presses the locking piece 90 of the loading plate 8 downward, and the operating arm 74 of the lever 12 is engaged with the engaging protrusion 54 of the reinforcing plate 10. A conventional IC socket assembly is shipped in this state (i.e., a locking portion of a lever presses a locking piece of a loading plate 8 downward, and an operating arm of a lever is engaged with an engaging protrusion of a reinforcing plate). At this time, an IC package is not mounted on the housing 2. In this state, downward pressure is applied on the housing by the loading plate. Therefore, there is a possibility that the loading plate will cause the housing to deform slightly.

However, the assembly 1 of the present invention is shipped in a state in which the locking piece 90 of the loading plate 8 is placed atop the locking portion 72 of the lever 12. Thereby, no downward force is exerted by the loading plate 8 to the housing 2 (refer to FIG. 2A) This state will be described in detail later.

Figure 9A:
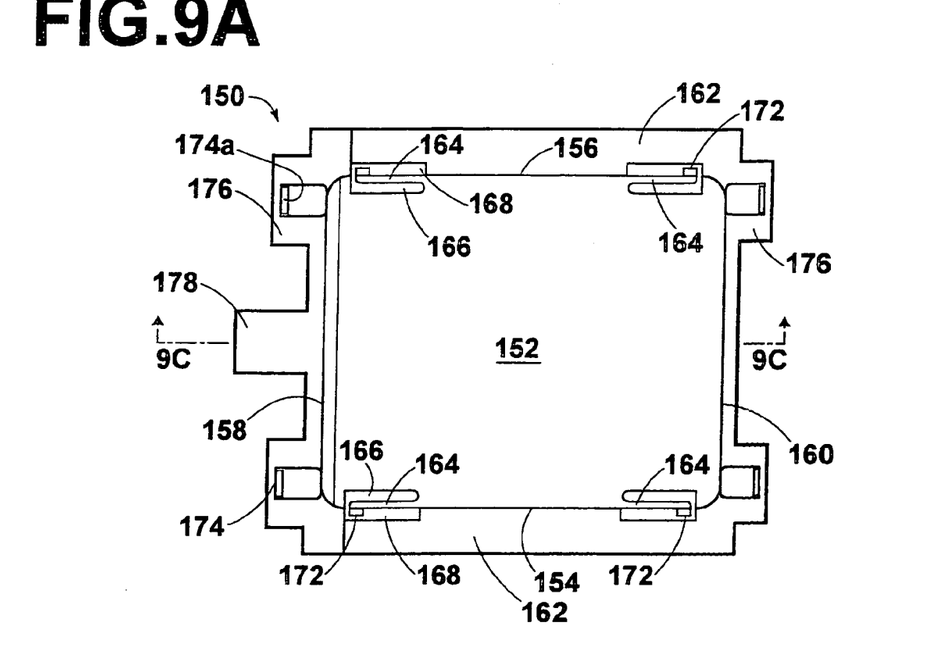
FIG. 9A is a plan view of a suction cap for an IC socket assembly according to an exemplary embodiment of the present invention.
Figure 9B:
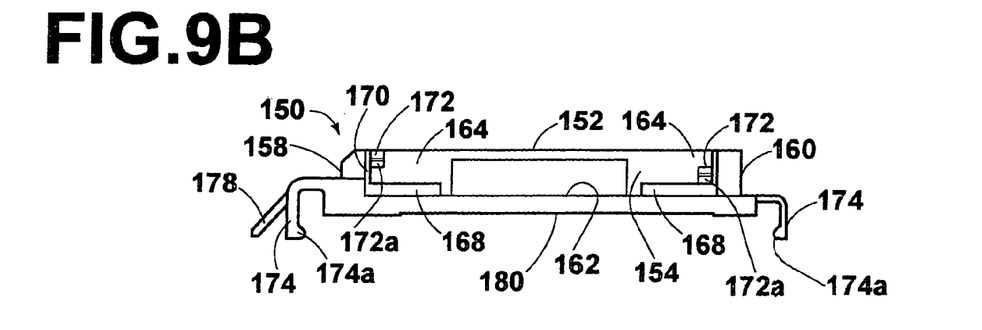
FIG. 9B is a front view of the suction cap of FIG. 9A.
Figure 9C:
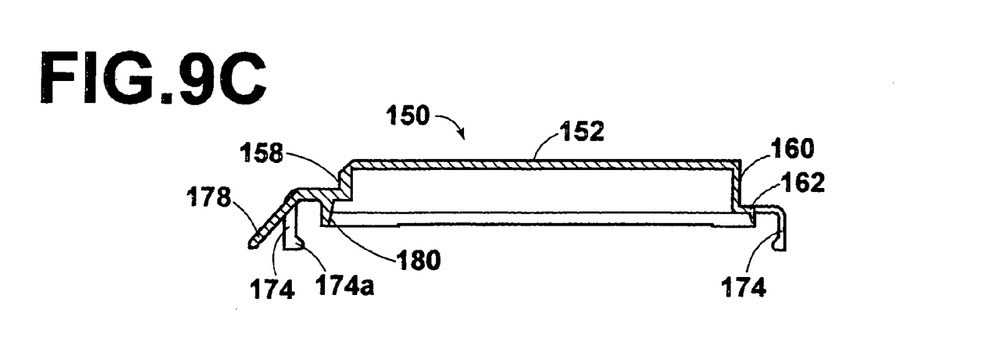
FIG. 9C is a sectional view of the suction cap of FIG. 9A taken along the line 9C—9C in FIG. 9A.
Figure 10A:
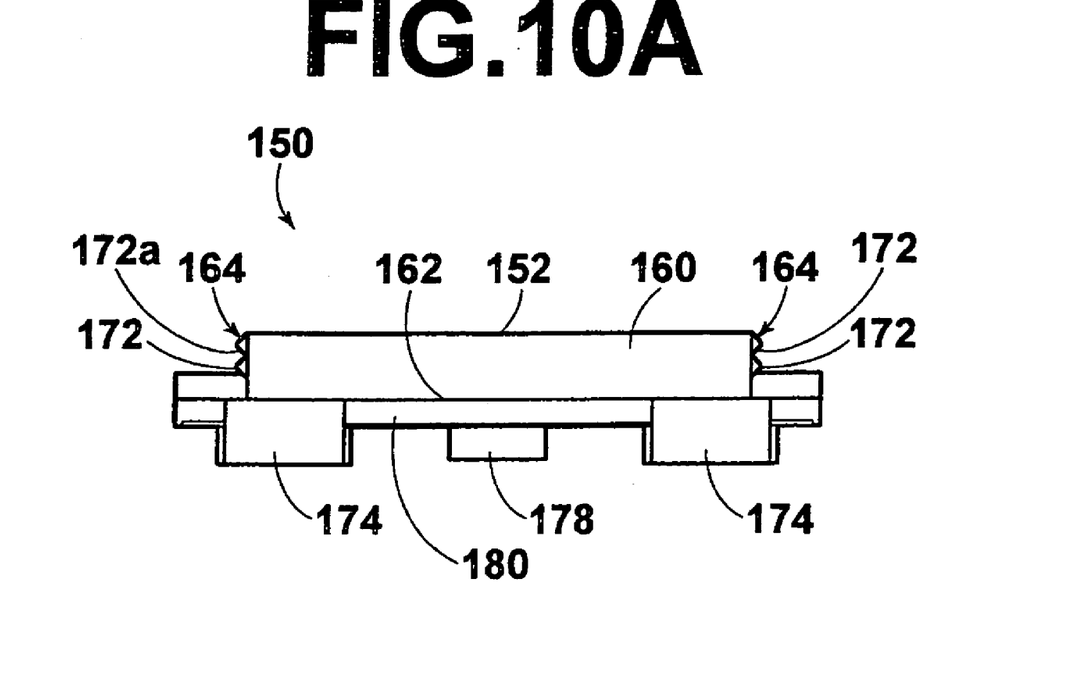
FIG. 10A is a right side view of the suction cap of FIG. 9A.
Figure 10B:
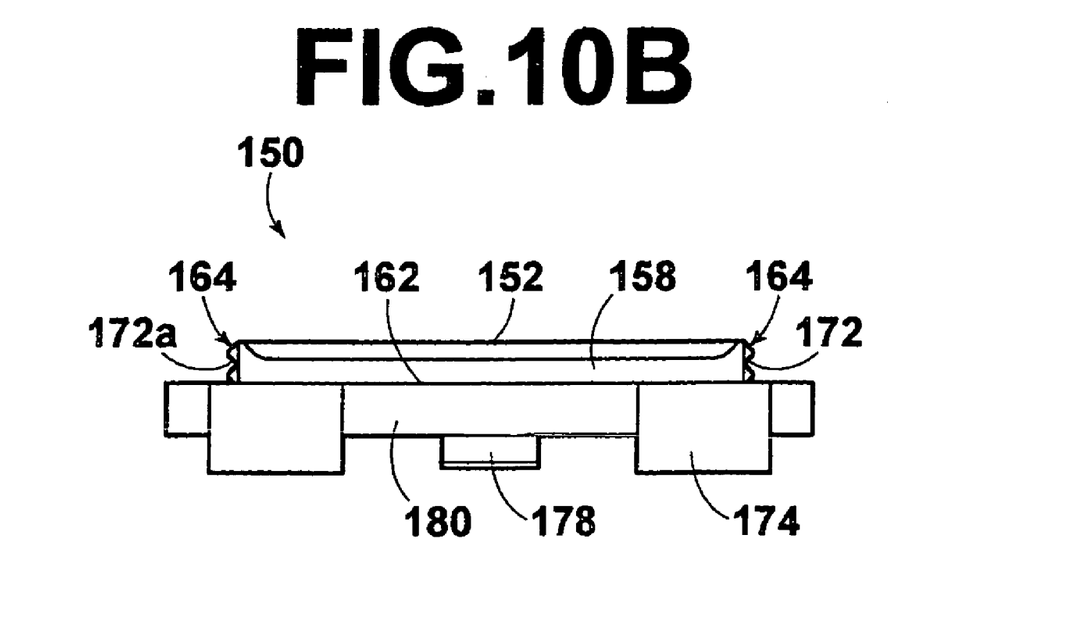
FIG. 10B is a left side view of the suction cap of FIG. 9A.

Next, the suction cap 150 of the present invention will be described with reference to FIGS. 9A, 9B, 9C, 10A, and 10B. FIG. 9A is a plan view, FIG. 9B is a front view, and FIG. 9C is a sectional view taken along the line 9C—9C in FIG. 9A, of the suction cap 150. FIG. 10A is a right side view and FIG. 10B is a left side view of the suction cap 150. In the description, the right side of the suction cap as illustrated in FIGS. 9A, 9B, and 9C will be referred to as the front, and the left side will be referred to as the rear. The suction cap 150 is built into the assembly 1 when the assembly 1 is shipped as a product. When the assembly 1 is to be mounted onto the circuit board 30, a suction nozzle of an apparatus (not shown) suctions the suction cap 150 to lift up the assembly 1, place it at a predetermined position on the circuit board 30, then mount the assembly 1 onto the circuit board 30.

The suction cap 150 is integrally molded from synthetic resin, and has a substantially rectangular shape. As shown in FIG. 1, the suction cap 150 comprises: a flat suction surface 152, which is complementary to the opening 84 of the loading plate 8; and walls 154, 156, 158, and 160, that extend downward from the periphery of the suction surface 152. The suction cap 150 further comprises a flange 162, which is continuous with the walls 154, 156, 158, and 160, and extends outward, substantially parallel to the suction surface 152. Pressing arms 164 (for engaging the loading plate) are formed in the vicinities of the four corners of the suction surface 152 to the front and rear of the side walls 154 and 156. The pressing arms 164 are defined by slots 166 and 168, which are formed in the four corners of the suction surface 152 and the walls 154 and 156, respectively. The slots 166 and 168 extend in the front to rear direction and slots 170 communicate with the slots 166 and 168. The slots 170 communicate with the slots 166, which are formed in the suction surface 152, and the slots 168, which are formed in the side walls 154, 156 and the flange 162. The slots 170 are formed perpendicular to the slots 166 and 168. Thus, the pressing arms 164 are cantilevered and have elasticity, which allows flexing thereof.

Latch protrusions 172 that protrude in directions perpendicular to the side walls 154 and 156 are formed on the free ends of the pressing arms 164. The two latch protrusions 172 at the rear side of the suction cap 150 are positioned above the side walls 154 and 156, that is, close to the suction surface 152. The two latch protrusions at the front side of the suction cap 150 are positioned below the free ends of the pressing arms 164 (as shown in FIG. 9B). Thus, the latch protrusions 172 are separated above and below on each of the walls 154 and 156, as illustrated in FIG. 10A and FIG. 10B. An inclined surface 172a is formed at the bottom of each of the latch protrusions 172. The edges 84a of the opening 84 in the loading plate 8 are engaged by the inclined surfaces 172a, as will be described later.

Two downwardly protruding mounting legs 174 (latch arms), which are separated from each other, are integrally formed with the flange 162, at each of the front and rear sides thereof. The mounting legs 174 are formed on front and rear rectangular extension portions 176 of the flange 162. The mounting legs 174 are of a cantilever structure and have inwardly facing latch protrusions 174a. That is, the latch protrusions 174a extend toward each other. As illustrated in FIG. 2A, when the suction cap 150 is placed on the bottom surface 18 of the package receiving aperture 16 of the housing 2, the mounting legs 174 are positioned at the exterior of the housing 2. The latch protrusions 174a engage with the engaging portions 36 of the housing 2, and the suction cap 150 is fixed to the housing 2. The latch protrusions 174a are engaged with the inclined surfaces 36c of the engaging portions 36.

As most clearly illustrated in FIG. 2A and FIG. 9A, a lever retention piece 178, which extends diagonally downward from the flange 168, is integrally formed with the suction cap 150 between the mounting legs 174 on the left side of FIG. 9A. The lever retention piece 178 extends through substantially the same vertical positions as the mounting legs 174. In addition, a mounting frame 180, which is of a rectangular shape complementary to the package receiving aperture 16 of the housing 2, is formed below the flange 162.

Next, the construction of the loading plate 8, the suction cap 150, the housing 2, and the reinforcing plate 10 when they are assembled, that is, in a shipment state, will be described with reference to FIG. 1 and FIGS. 2A, 2B, and 2C. As most clearly illustrated in FIG. 2A, the reinforcing plate 10 engages with the steps 24 at the bottom of the housing 2, and the suction cap 150 is placed in the package receiving aperture 16 of the housing 2. At this time, the lever retention piece 178 is positioned beneath the locking portion 72 of the lever 12. By this arrangement, the locking portion 72 abuts the lever retention piece 178, so that downward movement thereof is prevented. Therefore, the operating arm 74 of the lever 12 is prevented from rotating downward.

The loading plate 8 is then placed atop the suction cap 150 so that the suction surface 152 is exposed through the opening 84. At this time, the locking piece 90 is positioned atop the locking portion 72 of the lever 12. The edges 84a of the opening 84 engage with the latch protrusions 172 of the pressing arms 164 and are fixed thereto. At this time, the loading plate 8 is tilted so that the rear side, that is, the side toward the second end 6, is high, and the front end is low, as can be seen in FIG. 2A. Therefore, the edges 84a engage with the inclined surfaces 172a of the latch protrusions, which are positioned at vertical positions corresponding to the edges 84a. In this arrangement, the pressure applying points 84b of the loading plate 8 do not apply pressure to the housing 2. Accordingly, the housing 2 will not be deformed. In addition, the loading plate 8 is simply engaged to the suction cap 150. Therefore, no pressure is applied by the loading plate to the housing 2 via the suction cap 150.

At this time, the operating arm 74 of the lever 12 is engaged with the engaging protrusion 54, as shown in FIG. 1. In addition, the locking portion 72 of the lever 12 is held between the lever retention piece 178 of the suction cap 150 and the locking piece 90 of the loading plate 8. Therefore, the locking portion 72 is prevented from moving in the vertical direction. That is, downward rotation and shifting of the lever 12 during shipping is prevented. Accordingly, the generation of rattling noises during shipping, due to shifting of the lever 12, is suppressed. Further, the lever operating arm 74 is prevented from being rotated too low, thereby abutting the circuit board 30, after the assembly 1 is mounted onto the circuit board 30. Accordingly, the lever 12 becomes easy to operate.

As described above, the present invention satisfies the demand for lowering the overall height of the assembly during shipping, by engaging the lever 12 with the engaging protrusion 54. The present invention also satisfies the demand for shipping the assembly in a state in which the loading plate 8 does not exert pressure on the housing 2.

Note that the present invention is not limited to the embodiment described above. Various modifications are possible. For example, the pressing arms 164 of the suction cap 150 may be provided at two locations only on the side of the free end of the loading plate 8. As another example, the suction cap 150 may be mounted above the IC package mounting surface 18, such as on the upper surfaces of the outer peripheral walls 14.

What is claimed is:

1. A suction cap for an IC socket to be placed atop an insulative housing of an IC socket configured to receive an IC package pressed in place with a loading plate by operating a lever provided on the IC socket to mount the IC package within the IC socket, the suction cap comprising:
   a flat suction surface;
   latch arms for latching and engaging with the insulative housing of the IC socket; and
   loading plate holding pieces comprising latch protrusions that protrude from side walls of the suction cap that are configured to engage edges of an opening in the loading plate for holding the loading plate in a state in which the loading plate does not exert pressure on the insulative housing.

2. A suction cap for an IC socket as defined in claim 1, further comprising a lever retention piece that abuts a lever locking portion, which applies pressure on the loading plate.

3. A suction cap for an IC socket as defined in claim 1, wherein the latch protrusions are positioned at a front and rear of the suction cap and the latch protrusions at the rear of the suction cap are at a different elevation relative to the suction surface than the latch protrusions at the front of the suction cap.

4. A suction cap for an IC socket as defined in claim 3, wherein the latch protrusions at the rear of the suction cap are positioned closer to the suction surface than the latch protrusions at the front of the suction cap.

5. A suction cap for an IC socket as defined in claim 1, wherein the holding plate holding pieces comprise a lever retention piece extending diagonally downward from and integrally formed with the suction cap; the lever retention piece is configured to hold the locking portion of the lever between the lever retention piece of the suction cap and a locking piece of the loading plate.

6. An IC socket assembly, comprising:
   an insulative housing with an IC package mounting surface;
   a plurality of contacts disposed in the insulative housing;

a loading plate for holding an IC package between it and an IC package mounting surface and having a locking piece;

a lever with a locking portion for urging the loading plate to press the IC package against the IC package mounting surface; and a suction cap having a flat suction surface and latch arms that latch and engage with the insulative housing; the suction cap having loading plate holding pieces comprising latch protrusions that protrude from side walls of the suction cap that are configured to engage edges of an opening in the loading plate for holding the loading plate in a state in which the loading plate does not exert pressure on the insulative housing.

7. An IC socket assembly as defined in claim 6, wherein the loading plate holding pieces comprise a lever retention piece extending diagonally downward from and integrally formed with the suction cap; the locking portion of the lever being held between the lever retention piece of the suction cap and the locking piece of the loading plate.

8. An IC socket assembly as defined in claim 6, wherein the latch protrusions are positioned at a front and rear of the suction cap and the latch protrusions at the rear of the suction cap are at a different elevation relative to the suction surface than the latch protrusions at the front of the suction cap.

9. An IC socket assembly as defined in claim 6, wherein the suction cap further comprises a lever retention piece that abuts a lever operating portion, which applies pressure on the loading plate.

* * * * *